United States Patent [19]

Shibata et al.

[11] 4,335,505

[45] Jun. 22, 1982

[54] METHOD OF MAKING SEMICONDUCTOR MEMORY DEVICE HAVING MEMORY CELL ELEMENTS COMPOSED OF A TRANSISTOR AND A CAPACITOR

[75] Inventors: Hiroshi Shibata, Kawasaki; Tatsuya Enomoto, Itami, both of Japan

[73] Assignee: VLSI Technology Research Association, Kawasaki, Japan

[21] Appl. No.: 107,285

[22] Filed: Dec. 26, 1979

[30] Foreign Application Priority Data

Dec. 26, 1978 [JP] Japan .............................. 53-163807

[51] Int. Cl.³ .............................................. B01J 17/00
[52] U.S. Cl. .................................... 29/577 R; 29/571; 148/1.5; 148/187; 357/24; 357/41; 357/54
[58] Field of Search .................. 148/1.5, 187; 29/571, 29/577; 357/54, 41, 24

[56] References Cited

U.S. PATENT DOCUMENTS

| | | | |
|---|---|---|---|
| 4,115,795 | 9/1978 | Masuoka et al. | 357/24 |
| 4,173,819 | 11/1979 | Kinoshita | 29/571 |
| 4,232,439 | 11/1980 | Shibata | 29/579 |
| 4,240,195 | 12/1980 | Clemens et al. | 29/571 |
| 4,240,845 | 12/1980 | Esch et al. | 148/1.5 |

OTHER PUBLICATIONS

Fang et al., IBM-TDB, 14 (1972) 3363.
Suzuki et al., Jap. Jour. Appl. Phys., 16 (1977), 1979.
Tsui IBM-TDB, vol. 11 (1969), 1064.

*Primary Examiner*—Upendra Roy
*Attorney, Agent, or Firm*—Sughrue, Mion, Zinn, Macpeak & Seas

[57] ABSTRACT

A method for forming semiconductor memory devices each including either an MNOS-type or MOS-type transistor and an MNOS-type capacitor. Upon a silicon substrate there is formed a thick layer of oxide which defines the individual cells and provides separation therebetween. Exposed portions of the substrate are thermally oxidized to form a layer of thermal oxide upon which is subsequently deposited a layer of silicon nitride and a layer of polycrystalline silicon. The polycrystalline silicon is then masked and portions there are removed through apertures and the mask. The substrate is then irradiated at a non-perpendicular angle through the apertures in the mask and predetermined remaining portions of the layer of thermal oxide are removed. Exposed portions of the substrate at this point are diffused with an impurity of the opposite conductivity type to the substrate. A second polycrystalline silicon layer is then formed to provide bit lines for each memory cell and simultaneously an opposing electrode of the corresponding capacitors. A second thick oxide layer is then formed with a metal interconnection layer deposited thereon for forming the connection lines to each memory cell.

7 Claims, 13 Drawing Figures

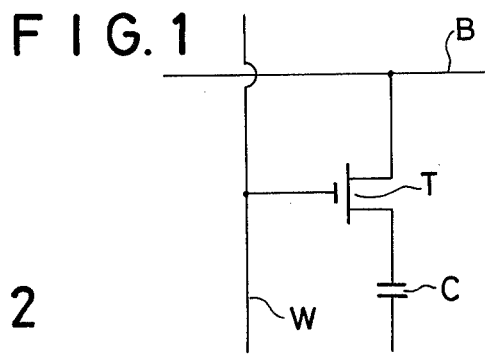
F I G. 1
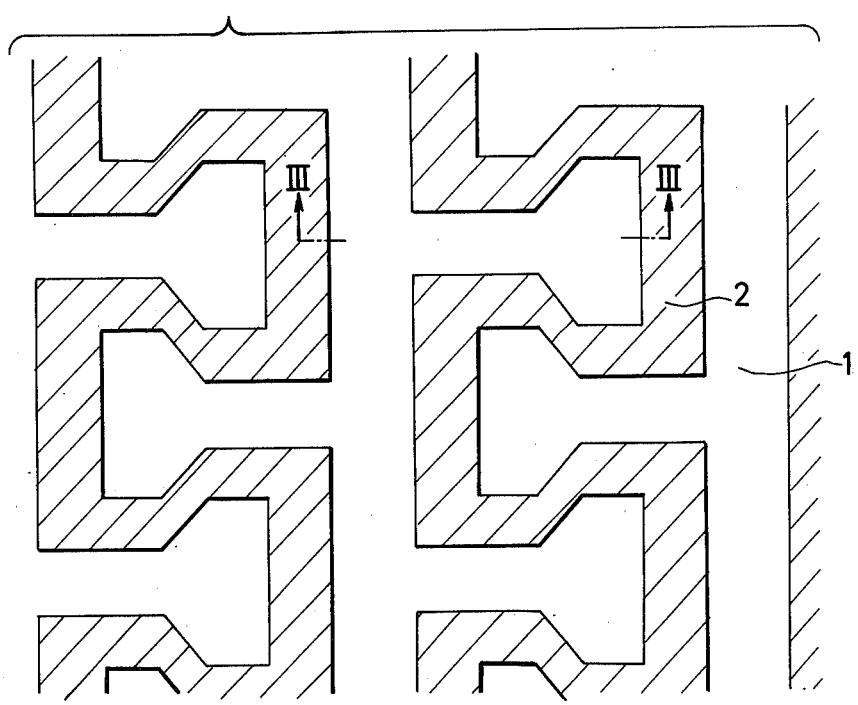
F I G. 2
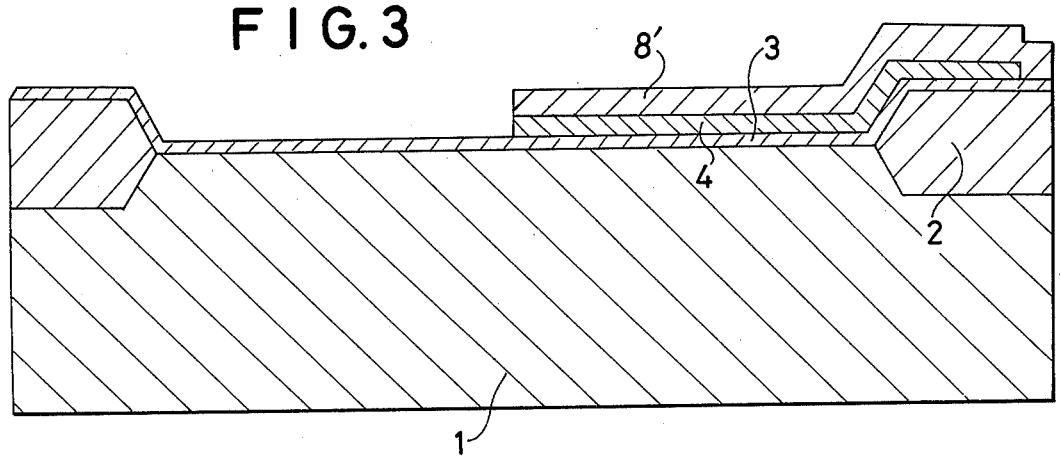
F I G. 3

METHOD OF MAKING SEMICONDUCTOR MEMORY DEVICE HAVING MEMORY CELL ELEMENTS COMPOSED OF A TRANSISTOR AND A CAPACITOR

BACKGROUND OF THE INVENTION

The present invention relates to a method for manufacturing semiconductor devices and, more particularly, to a method for manufacturing semiconductor memory devices each of which includes an MNOS-type transistor and an MNOS-type capacitor or includes an MOS-type transistor and an MNOS-type capacitor.

There are two primary types of semiconductor memory devices, a static type and a dynamic type. The static-type semiconductor memory device can generally operate at high speed. On the other hand, since the dynamic-type semiconductor memory device requires a small cell area, it is generally suitable for structuring memories of large capacity.

Recently, a dynamic-type memory element which is composed of a single transistor and a single capacitor and which has a minimum cell area has been widely used. The equivalent circuit of such a cell is shown in FIG. 1. In FIG. 1, the transistor, the capacitors, a bit line and a word line are depicted by T, C, B and W, respectively.

The conventional method of manufacturing the semiconductor memory shown in FIG. 1 will be described with reference to FIG. 2. In FIG. 2 a memory cell including an N channel MOS transistor having double crystal silicon layers and a capacitor is used as an example of the semiconductor memory element because the memory cell of the above type has wide applicability and is convenient for comparison with the present invention.

As shown in FIG. 2, a P-type silicon substrate 1 is used and thick oxide layers 2 are formed using a photographic method on portions of the surface of the substrate other than surface portions on which a drain gate and a capacitor are to be formed so as to provide electrical separation between unit elements. Following this, a thin oxide film 3 is formed on the exposed surface portion of the substrate as shown in FIG. 3. Thereafter, a polycrystalline silicon film 4 having a suitable thickness is epitaxially formed over the wafer.

In order to improve the electric conductivity of the polycrystalline silicon film 4, n-type impurities such as phosphorus are added thereto by thermal diffusion. An insulative layer 8' may be deposited on the impurity containing polycrystalline silicon layer 4 if necessary. Portions of the polycrystalline silicon film 4 and the insulative layer 8', if necessary, may be removed through a resist mask by plasma or chemical etching with portions left remaining in which the capacitor is to be formed.

After removing a portion of the oxide film 3 in an area in which a transfer transistor is to be formed, a thin oxide film 5 which is used as a gate oxide film of the transistor is formed in the same area as shown in FIG. 4. Thereafter, a polycrystalline silicon layer 6 is again formed using a method such as the CVD method to form a gate electrode of the transistor as shown in FIG. 4. Then by using the polycrystalline silicon layers 4 and 6 as masks, n-type impurities are introduced into the silicon substrate 1 by a suitable method such as thermal diffusion or ion injection to form a drain region 7.

With reference to FIG. 5, after an oxide layer 8 is formed over the entire surface of the wafer by a suitable method such as the CVD method, a contact hole 9 for the gate electrode is formed using a photographic method in the oxide film 8 through which a metal contact layer 10 formed of a material such as aluminum which is vapor deposited. Then, an interconnection layer of aluminum which is connected to the gate electrode is formed using a photographic method to obtain a word line W. FIG. 6 is a plan view of the memory cell thus produced. As shown in FIG. 5, the contact hole 9 extends over two memory cells.

It is well known that the higher the element density required in a MOS LSI device the smaller must be the size of an individual memory cell. With this requirement, the size of contact hole 9 should be made smaller as the element density increases. Unfortunately, a reduction in the size of the contact hole produces other problems. Namely, it is very difficult as a practical matter to form many small contact holes with a high precision and there is a high probability of damage to the interconnection material, that is the aluminum layers, due to the presence of a step existing at an edge portion of the contact hole. In order to eliminate the latter problem, a large amount of some material such as phosphorus may be added to the oxide layer 8 and the sharp edge portion of the contact hole may be rounded. Use of such techniques, however, enlarges the area of the contact hole thereby limiting the reduction of the cell area. Further, with a reduction of the contact hole size, the contact resistance between the polycrystalline silicon substrate and the aluminum electrode becomes large causing a degradation of the electrical characteristics of the cell.

Since a conventional memory cell has three formed layers, namely, a pair of polycrystalline silicon layers and an aluminum layer, there are many stepped portions in the cell. These stepped portions may cause damage to the interconnection layers. This is especially true when the interconnections include thin aluminum leads. In this connection, the electric insulation between the first polycrystalline silicon layer and the second polycrystalline silicon layer is relatively poor because the thickness of the oxide layer existing therebetween is at most on the same order of thickness as the gate oxide layer.

Furthermore, the capacitance between the electrodes, which should be as small as possible, is rather large. In addition to the above mentioned defects in the conventional semiconductor memory device, the thinner the thickness of the oxide layer between the first polycrystalline silicon layer and the silicon layer corresponding to the capacitor portion the larger will be the cell size. Therefore, possible small defects in the thin oxide layer may provide passage for leakage current resulting in damage to the cell.

SUMMARY OF THE INVENTION

An object of the present invention is to provide a method for manufacturing a semiconductor memory device which has no such defects as those inherent in the conventional device.

Another object of the present invention is to reduce the current leakage due to the formation of the contact holes, stray capacitances between the respective electrode layers and small defects in the gate oxide layer and to provide a diffusion region corresponding to the bit line, the production of the gate of the transfer transistor and the region corresponding to the capacitor using only a single mask alignment.

These, as well as other objects of the invention, may be met by a method for producing a semiconductor memory device including multiple memory cell elements each of which is composed of a transistor and a capacitor, the method including the steps of providing a substrate of silicon containing impurities of a first conductivity type, forming a first thick layer of oxide on a surface of the substrate in a predetermined pattern for providing separation between adjacent memory cell elements, thermally oxidizing exposed portions of the surface of the substrate so as to form a first layer of thermal oxide, depositing a layer of silicon nitride over the layer of thermal oxide and the thick layer of oxide, depositing a first layer of polycrystalline silicon over the first layer of silicon nitride, forming a layer of photoresist over the layer of polycrystalline silicon in a predetermined pattern, removing portions of the first layer of polycrystalline silicon exposed through apertures in the layer of photoresist, irradiating the substrate through apertures in the photoresist layer, removing the photoresist layer and predetermined remaining portions of the layer of thermal oxide, providing portions of the substrate exposed through the steps of irradiating and removing with an impurity of a second conductivity type, forming second polycrystalline silicon layers in predetermined regions so as to form simultaneously bit lines for each of the memory cells and an opposing electrode of each capacitor for each of the cells, oxidizing exposed regions of the substrate and the first-mentioned layer of polycrystalline silicon to form second thick oxide layers, forming a layer of metal over uppermost layers on the surface of the substrate, and etching the layer of metal to as to form connection lines to each of the memory cell which extends to peripheral circuits such as those used for addressing and driving each memory cell. If desired, rather than oxidizing the exposed regions of the substrate and the first-mentioned layer of polycrystalline silicon to form second thick oxide layers, predetermined portions of the layer of silicon nitride may be removed along with the layer of thermal oxide. This is followed by forming a thin oxide film over the uppermost layers of the substrate.

For the irradiating step, the irradiating beam is directed to the substrate at a non-perpendicular angle thereto. For the irradiating beam, an ion beam, a light beam, a X-ray beam or a beam of charged particles may be utilized. For the step of oxidizing, preferably the substrate is heated in an oxidizing atmosphere at a pressure of greater than 1 atm. and at a temperature of no greater than 900° C.

BRIEF DESCRIPTION OF THE DRAWINGS

FIG. 1 is an equivalent circuit of a dynamic type memory cell composed of a transistor and a capacitor;

FIG. 2 is a plan view of a silicon substrate having a thick oxide pattern;

FIGS. 3 to 5 are cross sections taken along a line III—III in FIG. 2 showing steps of the conventional method for manufacturing a memory cell.

DETAILED DESCRIPTION OF THE PREFERRED EMBODIMENTS

Figure 4:
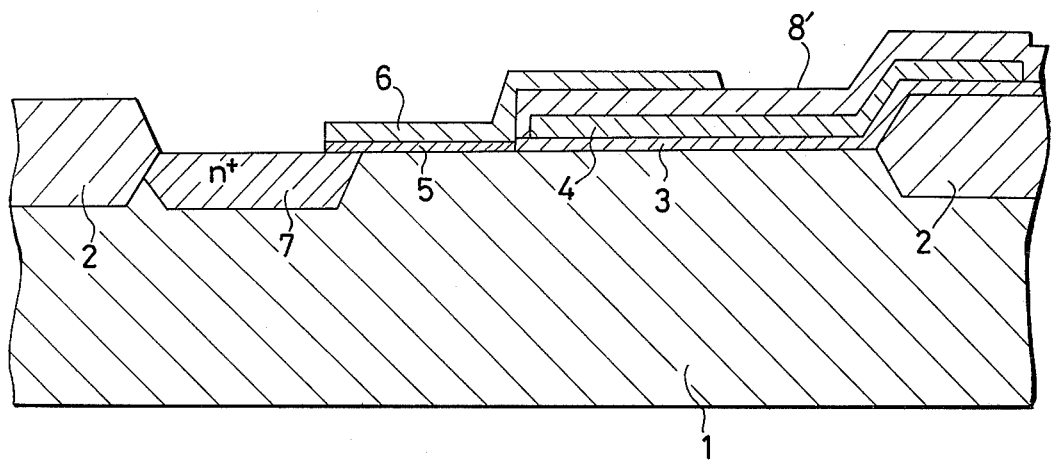
Figure 5:
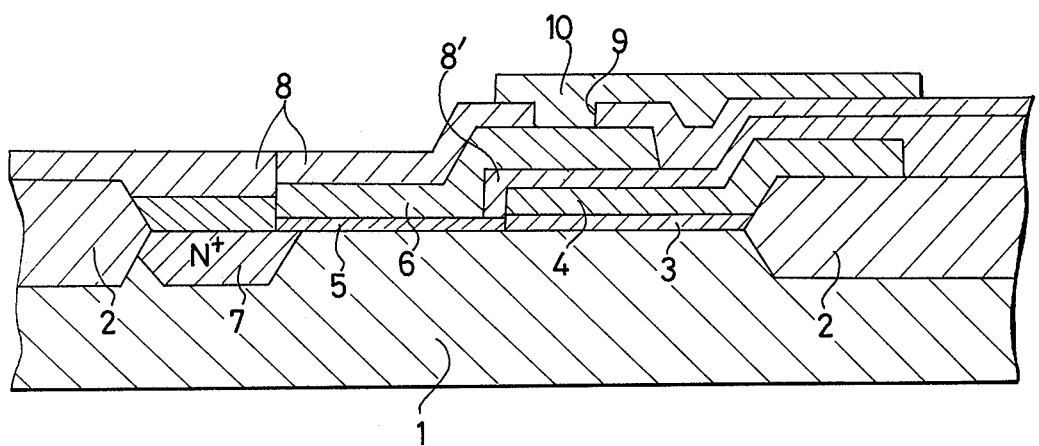
Figure 6:
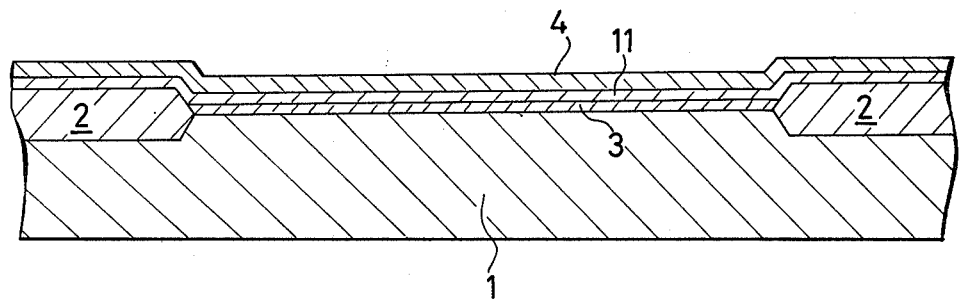
FIGS. 6, 7a, 7b, 8a, 8b and 10a, 10b show steps of the method of manufacturing a memory cell according to the present invention.

In FIG. 6, a thick oxide film pattern 2 is formed on a surface of a p-type silicon substrate 1 in a conventional manner to provide an electric separation between adjacent elements to be formed thereon.

A second oxide film 3, which becomes an insulative layer for a capacitor portion of the memory cell, is formed by thermal oxidation of the remaining portion of the substrate surface. Following this, a silicon nitride ($Si_3N_4$) layer 11 is deposited thereon using a CVD method and a polycrystalline silicon layer 4 is further formed on the silicon nitride layer 11 also by using a CVD method as shown.

Figure 7A:
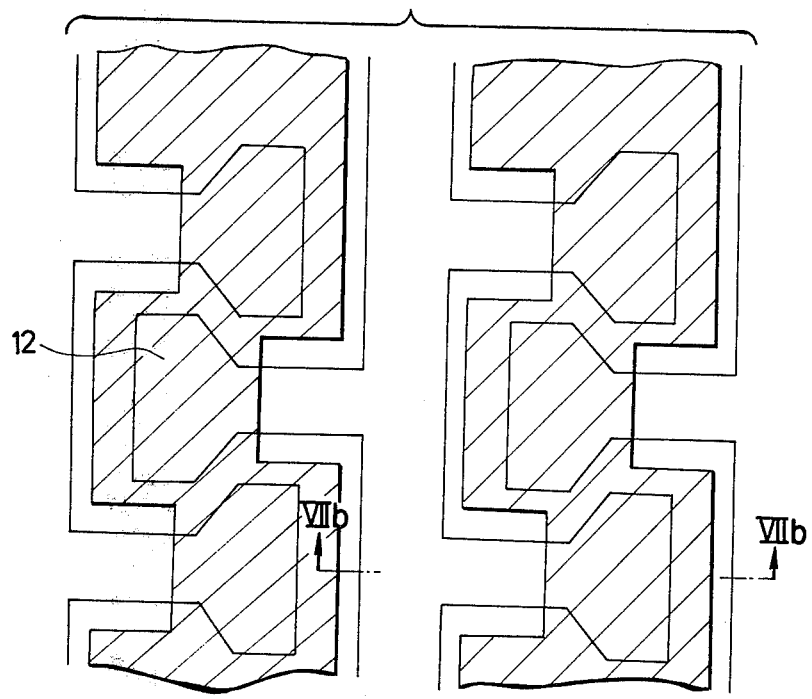
Figure 7B:
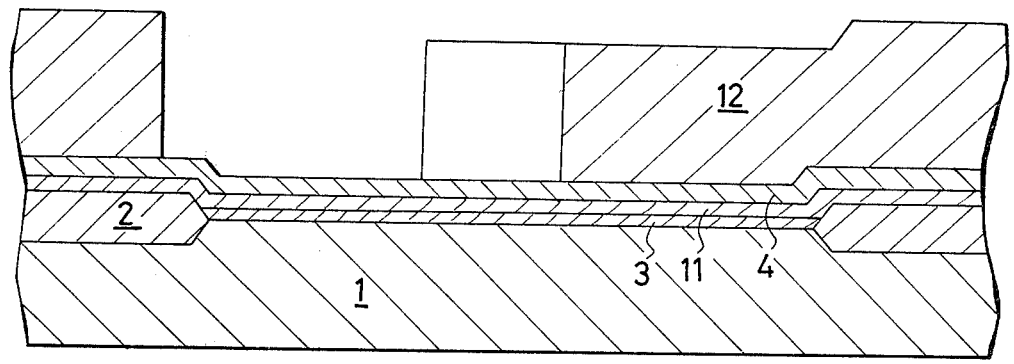
Figure 8B:
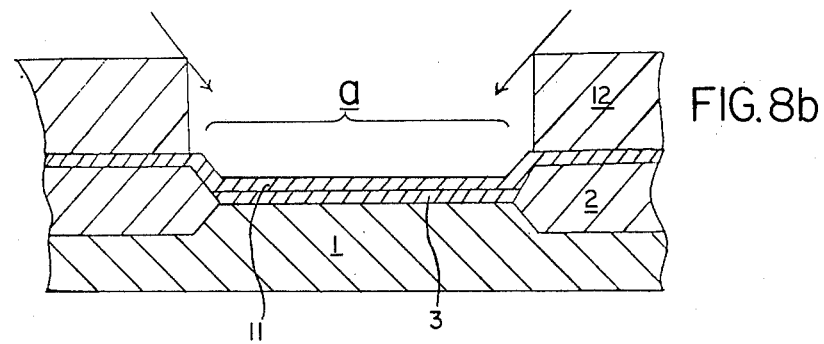

Thereafter, a relatively thick photoresist layer 12 is formed on the polycrystalline silicon layer photographically as shown in FIGS. 7a and 7b. The photoresist layer 12 is etched with a mask shown in FIG. 7a. FIG. 7b shows a cross section taken along line VII—VII in FIG. 7a. Portions of the polycrystalline silicon layer 4 which are not covered by the resist 12 are removed by plasma etching or chemical etching. Then, the wafer is irradiated with ion beams in the inclined directions shown by arrows in FIG. 8b which shows a cross section taken along a line VIIIB—VIIIB in FIG. 8a. The silicon nitride layer 11 in areas b is etched away by the ion beam. However, very little of the layer 11 in areas a is etched because it is protected by the thick resist layer 12 from the ion beams. If desired, a light beam, X-ray or charged particle beams may be used for this purpose instead of the ion beam.

Figure 8C:
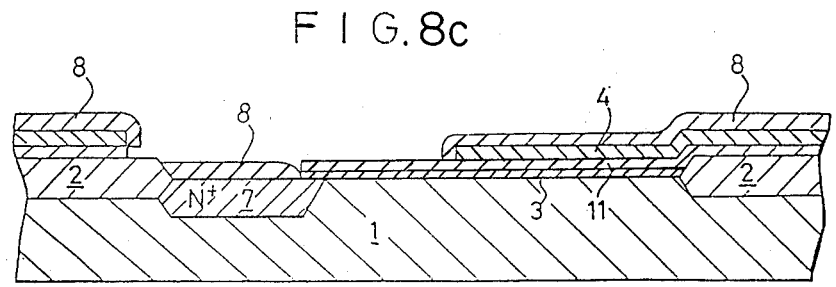
Figure 8A:
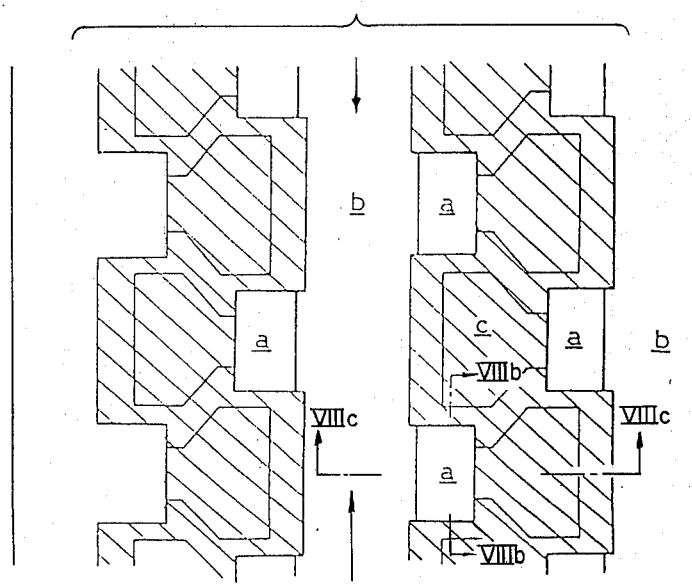

Next, the resist layer 12 on the silicon surface is removed and the oxide film 3 remaining in the areas b is etched away with a suitable acid. Then, n-type impurities such as phosphorus are added to the silicon substrate 1 in the regions b and the polycrystalline silicon layer 4 in the regions c by thermal diffusion or ion bombardment as shown in FIG. 8c which is a cross section taken along a line VIIIC—VIIIC in FIG. 8a. At this time, the silicon substrate 1 regions a are masked by the silicon nitride layer 11 and the oxide layer 3 and so that there is no introduction of the impurities thereto. At this stage, the polycrystalline silicon layers which are to become the bit lines of the memory and the opposing electrode of the capacitors are formed in the regions b and c, respectively. Following this, the silicon substrate is treated in an oxidation environment so that the silicon and polycrystalline silicon surface portions which contain phosphorus are oxidized while those marked by the silicon nitride layer 11 are not. In this case, it is preferable to oxidize the regions b and c (capacitor electrode and diffusion region) in an oxidizing ambient higher in pressure than 1 atm. at a temperature at or lower than 900° C., under which, while the growth speed of oxide film is kept relatively high, the induction of crystal defects in the silicon portion is prevented. In this fashion, thick oxide layers 8 are formed on the regions b and c.

Figure 9:
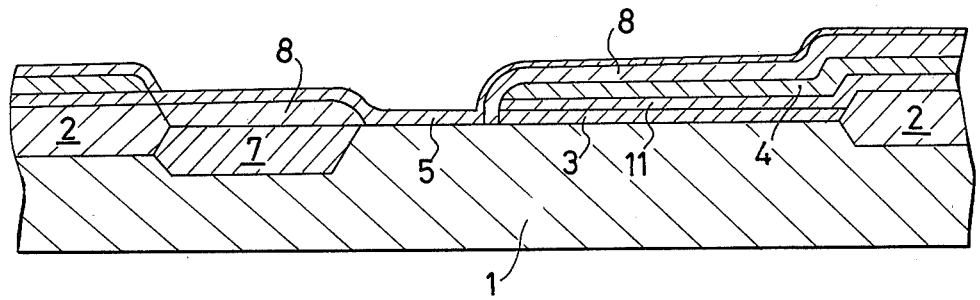

As desired, it is possible to remove the portions of the silicon nitride layer 11 and the oxide layer 3 in the region a and then to newly form a thin oxide film 5 or a double layer of an oxide and a silicon nitride thereon as shown in FIG. 9. At this stage, a sufficiently thick oxide layer 8 or a sufficiently thick double layer of oxide and silicon nitride is formed on the polycrystalline silicon layer 4 which is used as an insulation layer for the metal connection layer or the polycrystalline silicon layer.

Figure 10A:
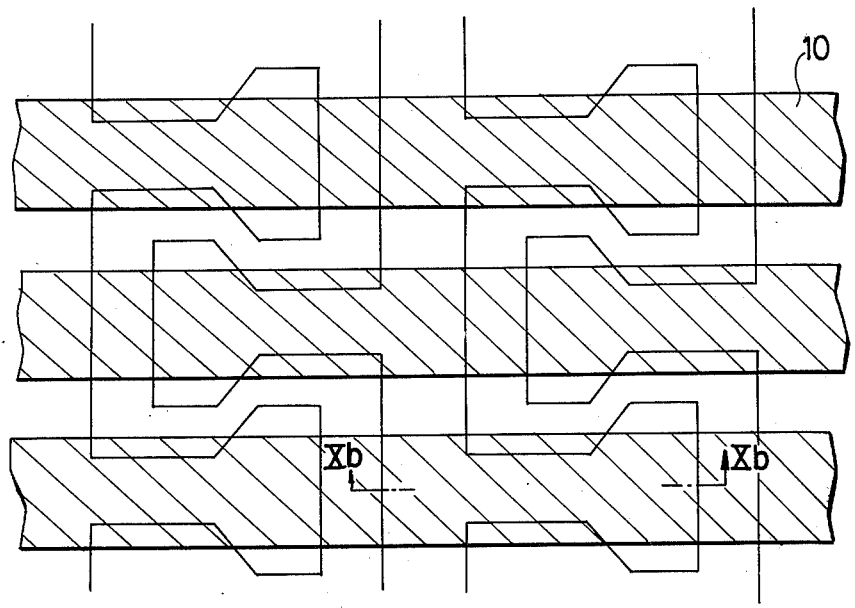
Figure 10B:
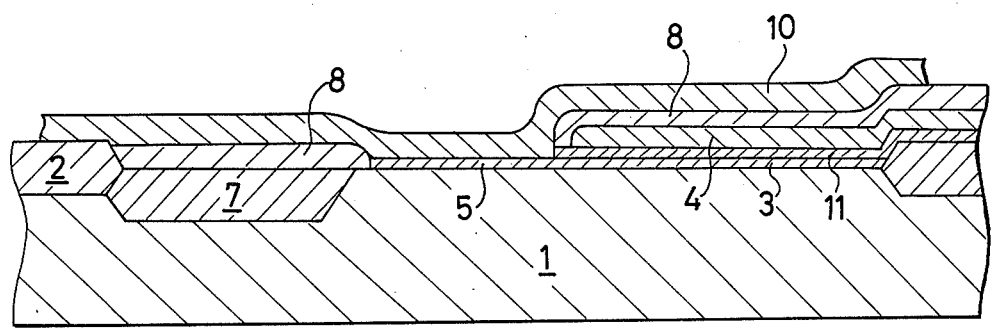

Then, a metal layer such as aluminum or molybdenum or a polycrystalline silicon layer is deposited over the entire surface by vapor-deposition or using CVD deposition. The metal layer 10 is etched photographically using a mask as shown in FIGS. 10a and 10b. FIG. 10b shows a cross section taken along a line X—X in FIG. 10a. For an IC memory, a peripheral circuit including a driving circuit for the memory cell, readout and discrimination circuits and the like are required in addition to the memory cell. Therefore, in forming transistors for the circuit network, it is necessary to form the polycrystalline silicon layer for the capacitors in such a manner that it can also be used at the gate electrode of the transistors. Alternatively, the gates of the transistors of the peripheral circuit may be formed simultaneously with the formation of the gate electrode of the transistor which forms the transfer gate of the memory.

When a metal such as aluminum or molybdenum is used for the gate electrode for the transfer gate it may be used also as leads to the peripheral circuits. In this case, there is a resulting advantage of a reduction of the number of masks necessary for the photolithographic printing process in comparison with the conventional structure having two polycrystalline silicon layer.

An IC memory constructed in accordance with the present invention possesses the following advantages in comparison with a memory having the conventional structure. First, since the capacitor insulating layer between the first polycrystalline silicon layer and the silicon substrate can be formed by the silicon oxide layer and the silicon nitride layer, a thin film is obtained in which there is a very small leakage current and with a high degree of insulation. Since the dielectric constant of silicon nitride is about twice that of silicon dioxide, the capacitance per unit area for the same layer thickness is significantly increased.

The silicon oxide layer and the silicon nitride layer can be used as a mask for preventing oxidation of the silicon surface on the transfer gate region during formation of the oxide layer on the diffusion layer and the polycrystalline silicon layer (electrode surface of the capacitor) of the memory cell.

Due to use of angled irradiation with an ion beam the diffusion region, the transfer gate region and the capacitor region are determined by a single photolithographic resistration procedure. This is a very important effect of the present invention in comparison with the conventional technique which requires several resistration procedures.

In addition to the above-mentioned advantages, since the connection of the word leads to the gate electrode of the transistor of the transfer gate is formed simultaneously with the formation of the electrodes, there is no need for providing contact holes as in the conventional device.

The method of the present invention is very effective when the memory cell is to be incorporated in a large scale integrated circuit, when the area to be occupied by the cell is very limited and it is difficult to form contact holes and/or when the permissible width of the word connection lines and the space therebetween is very small.

What is claimed is:

1. A method for producing a semiconductor memory device including multiple memory cell elements, each cell being composed of a transistor and a capacitor, comprising the steps of:

providing a substrate of silicon having a first conductivity type;
forming a first thick layer of oxide on a surface of said substrate in a predetermined pattern for providing separation between adjacent memory cell elements;
thermally oxidizing exposed portions of said surface of said substrate to form a layer of thermal oxide;
depositing a layer of silicon nitride over said layer of thermal oxide and said thick layer of oxide;
depositing a first layer of polycrystalline silicon over said layer of silicon nitride;
forming a layer of photoresist over said layer of polycrystalline silicon in a predetermined pattern;
removing portions of said first layer of polycrystalline silicon exposed through apertures in said layer of photoresist;
irradiating said substrate at a non-perpendicular angle through apertures in said photoresist layer;
removing said photoresist layer and predetermined remaining portions of said layer of thermal oxide;
providing impurities having a second conductivity type to portions of said substrate exposed through said steps of irradiating;
removing said layer of polycrystalline silicon in predetermined regions so as to form bit lines for each memory cell and opposing electrode of each said capacitor;
oxidizing exposed regions of said substrate and said layer of polycrystalline silicon to form second thick oxide layers;
forming a layer of metal over uppermost layers or said surface of said substrate; and
etching said layer of metal to form connection lines to each said memory cell.

2. A method for producing a semiconductor memory device including multiple memory cell elements, each cell being composed of a transistor and a capacitor, comprising the steps of:

providing a substrate of silicon having a first conductivity type;
forming a first thick layer of oxide on a surface of said substrate in a predetermined pattern for providing separation between adjacent memory cell elements;
thermally oxidizing exposed portions of said surface of said substrate to form a layer of thermal oxide;
depositing a layer of silicon nitride over said layer of thermal oxide and said thick layer of oxide;
depositing a layer of polycrystalline silicon over said layer of silicon nitride;
forming a layer of photoresist over said layer of polycrystalline silicon in a predetermined pattern;
removing portions of said first layer of polycrystalline silicon exposed through apertures in said layer of photoresist;
irradiating said substrate at a non-perpendicular angle through apertures in said photoresit layer;
removing said photoresist layer and predetermined removing portions of said layer of thermal oxide;
providing impurities having a second conductivity type to portions of said substrate exposed through said steps of irradiating;
removing said layer of polycrystalline silicon layers in predetermined regions so as to form bit lines for each said memory cell and an opposing electrode of each said capacitor;

removing predetermined portions of said layer of silicon nitride and said layer of thermal oxide;

forming a thin oxide film over uppermost layers on said substrate;

forming a layer of metal over uppermost layers on said surface of said substrate; and etching said layer of metal to form connection lines to each said memory cell.

3. A method as claimed in any of claims 1 or 2 wherein said irradiating is carried out by means of a light beam.

4. A method as claimed in any of claims 1 or 2 wherein said irradiating is carried out by means of an X-ray beam.

5. A method as claimed in any of claims 1 or 2 wherein said irradiating is carried out by means of a beam of charged particles.

6. A method as claimed in any of claims 1 or 2 wherein said oxidizing is carried out by heating said substrate in an oxidizing atmosphere at a pressure greater than 1 atmosphere and at a temperature of no greater than 900° C.

7. A method as claimed in any of claims 1 or 2 further comprising following said step of forming said thin oxide film, the step of forming a layer of silicon nitride on said thin oxide film.

* * * * *